United States Patent
Phan et al.

(10) Patent No.: US 7,601,919 B2
(45) Date of Patent: Oct. 13, 2009

(54) PRINTED CIRCUIT BOARDS FOR HIGH-SPEED COMMUNICATION

(75) Inventors: Chinh Q. Phan, Fremont, CA (US); Robert P. Lombaerde, Belmont, CA (US); Jignesh H. Shah, Sunnyvale, CA (US)

(73) Assignee: NeoPhotonics Corporation, San Jose, CA (US)

( * ) Notice: Subject to any disclaimer, the term of this patent is extended or adjusted under 35 U.S.C. 154(b) by 351 days.

(21) Appl. No.: 11/255,724

(22) Filed: Oct. 21, 2005

(65) Prior Publication Data

US 2007/0090894 A1    Apr. 26, 2007

(51) Int. Cl.
 *H05K 1/00* (2006.01)
(52) U.S. Cl. .................. 174/254; 174/261; 174/363; 361/792; 361/789
(58) Field of Classification Search .................. 174/254, 174/250, 251, 261, 255, 356, 363, 378, 379, 174/380; 361/792, 748–751, 784, 785, 789, 361/736; 257/696, 700, 703; 439/67; 219/209, 219/424

See application file for complete search history.

(56) References Cited

U.S. PATENT DOCUMENTS

| | | | | |
|---|---|---|---|---|
| 4,798,918 A * | 1/1989 | Kabadi et al. | ............... | 174/36 |
| 5,121,297 A * | 6/1992 | Haas | ................... | 361/751 |
| 5,939,952 A * | 8/1999 | Noda et al. | ................... | 333/1 |
| 5,981,870 A * | 11/1999 | Barcley et al. | ............. | 174/254 |
| 6,555,745 B1 * | 4/2003 | Kruse et al. | ................. | 174/394 |
| 6,797,891 B1 * | 9/2004 | Blair et al. | ................. | 174/268 |
| 6,879,032 B2 * | 4/2005 | Rosenau et al. | ............ | 257/696 |
| 6,974,333 B2 * | 12/2005 | Wildes et al. | ................ | 439/67 |
| 2004/0037050 A1 * | 2/2004 | Nakayama et al. | .......... | 361/736 |
| 2005/0162840 A1 * | 7/2005 | Morita | ....................... | 361/784 |

OTHER PUBLICATIONS

International Search Report for PCT/US06/040729 filed on Jul. 14, 2008.
Written Opinion of the International Searching Authority for PCT/US06/040729 filed on Jul. 14, 2008.

\* cited by examiner

*Primary Examiner*—Dean A. Reichard
*Assistant Examiner*—Hoa C Nguyen
(74) *Attorney, Agent, or Firm*—Turocy & Watson, LLP

(57) ABSTRACT

Apparatus and method for communicating high-speed signals between a primary printed circuit board and one or more secondary printed circuit boards. The high-speed signals are communicated between the primary printed circuit boards and the secondary printed circuit boards through multi-layer flexible conductors.

20 Claims, 7 Drawing Sheets

Customer Name:         P/N:

| Layer | Material | Thickness |
|---|---|---|
| Layer 1 | LPI Soldermask | 0.0010 |
|  | 3/4 Oz ED Cu | 0.0010 |
|  | FR406-1080 Epoxy Prepreg | 0.0027 |
|  | FR406-1080 Epoxy Prepreg | 0.0027 |
| Layer 2 | 1/2 Oz ED Cu | 0.0007 |
|  | GFN 0.005 | 0.0050 |
| Layer 3 | 1/2 Oz ED Cu | 0.0007 |
|  | FR406-1080 Epoxy Prepreg | 0.0027 |
|  | FR406-1080 Epoxy Prepreg | 0.0027 |
|  | Flexible Liquid Epoxy Covercoat (JT 7130) | 0.001 |
| Layer 4 | 1/2 Oz Cu | 0.0007 |
|  | 0.003 Polyimide Film (Kapton AP) | 0.003 |
| Layer 5 | 1/2 Oz Cu | 0.0007 |
|  | Flexible Liquid Epoxy Covercoat (JT 7130) | 0.001 |
|  | FR406-1080 Epoxy Prepreg | 0.0027 |
|  | FR406-1080 Epoxy Prepreg | 0.0027 |
| Layer X | 3/4 Oz ED Cu | 0.0010 |
|  | LPI Soldermask | 0.0010 |

Flex Area Thickness    0.0064      Total Rigid Area Thickness :   0.0310

FIG. 4

PRINTED CIRCUIT BOARDS FOR HIGH-SPEED COMMUNICATION

BACKGROUND

The present invention relates generally to the field of communication systems. More specifically, embodiments of the invention relate to a system for communicating high-speed signals between multiple printed circuit boards (PCBs).

A PCB is found in almost every electronic device. Electronic components and integrated circuits (ICs) in a device are mounted on the PCB. A network of wires provides the electrical connections between the electronic components mounted on the PCB. These wires are referred to as 'traces'.

The most basic PCBs have the electronic components mounted on one side of the board and the traces on the opposite side. These PCBs are called single-sided PCBs. However, these PCBs have several limitations when it comes to routing the traces. This is because the conducting traces are present only on one side and they cannot cross each other. Therefore, the single-sided PCBs have been replaced by double-sided PCBs, which have traces on both sides of the board. The double-sided PCBs overcome most of the limitations of the single-sided PCBs. Thus, double-sided PCBs are more suited for complex circuits. To further increase the area available for wiring, multi-layer PCBs are used which have one or more traces inside the board. The total number of layers in multi-layer PCBs is usually an even number. The total number of layers includes the two outer layers. Most multi-layer PCBs have a total of four to eight layers.

Modern communication systems are increasingly dependent on high-speed signaling. Complicated PCB-based circuits are required to support higher communication speeds. These circuits, in turn, require greater packaging space. However, greater packaging space implies an unrealizable increase in the size of the communication equipment that comprise the packages. Accordingly, higher communication speeds have led to a need for packing the circuits in compact spaces. Thus, there is an increasing demand for greater miniaturization. Flexible circuits help in realizing this demand. Therefore, the need for improved fabrication methods for making flexible circuits is becoming more important. This has forced PCB designers to not only use multi-layer PCBs, but to modularize systems that have multiple PCBs. Presently, the signals travel between these multiple PCBs by way of jumpers, connectors and cable wires. However, jumpering between the PCBs with the cable wires or other connectors does not provide the performance that is required for communicating high-speed signals. A variety of fabrication and assembly techniques are used to attach the connectors to the multiple PCBs such as pins soldered into plates through holes, pins with compliant sections pressed into plates through holes, and surface mounted leads attached to pads on the surface of the PCB.

The above-mentioned techniques require additional processing efforts to attach the connectors to the PCBs. Separate connector components and processing efforts increase the cost of assembling the PCBs. In addition, such techniques require soldering different components together. However, soldering leads to reliability problems associated with the solder joints. Further, it is difficult to maintain uniform impedance between the multiple PCBs and the connectors using the above-mentioned techniques. The variation in the impedance leads to the problem of reflections. Reflections are unwanted signals that propagate on the signaling paths due to an impedance mismatch. As a result, it is difficult to maintain the integrity of high-speed signals that are communicated between the multiple PCBs. Furthermore, the jumpers, the connectors, and the cable wires used in the above-mentioned techniques are not flexible. As a result, it is difficult to pack the different components in a small volume.

Hence, there exists a need for a system and a method that preserves the integrity of high-speed signals between multiple PCBs. Also, there is a need for a system and a method for connecting different PCBs so that uniform impedance is maintained. In addition, there is a need for a system that is cost effective, reliable and less voluminous.

SUMMARY

Embodiments of the invention provide a system and a method for high-speed communication.

An object of the invention is to provide a system for high-speed communication between a plurality of PCBs, comprising a primary PCB; at least one secondary PCB; and at least one multi-layer flexible conductor for communicating high-speed signals between the primary PCB and the secondary PCB while maintaining a constant impedance between the primary PCB and the at least one secondary PCB, the multi-layer flexible conductor enabling the secondary PCB to be placed at an angle with respect to the primary PCB.

Another object of the invention is to provide a system for high-speed communication between a plurality of PCBs, comprising a primary PCB; at least one secondary PCB; and at least one multi-layer flexible conductor for communicating high-speed signals between the primary PCB and the secondary PCB, the multi-layer flexible conductor comprising at least two layers; and signal traces, wherein the signal traces are present on the layers and are separated by an insulating material, the width and spacing of the signal traces are constructed and arranged so that a constant impedance is maintained between the primary PCB and the at least one secondary PCB.

Yet another object of the invention is to provide a method for communicating high-speed signals between PCBs, the method comprising interconnecting a primary PCB with at least one secondary PCB, wherein the interconnection is through multi-layer flexible conductors comprising signal traces separated by an insulating material; maintaining constant impedance between the primary PCB and the secondary PCB; and sending high-speed signals between the primary PCB and the secondary PCB while the constant impedance is maintained.

A system and a method in accordance with the embodiments of the invention enable communication of high-speed signals between a primary PCB and a plurality of secondary PCBs through a plurality of multi-layer flexible conductors. The secondary PCBs are flexibly connected to the primary PCB through multi-layer flexible conductors. These multi-layer flexible conductors enable the secondary PCBs to be positioned at any angle with respect to the primary PCB. The multi-layer flexible conductor comprises signal traces separated by an insulating material. The width and the separation between the signal traces can be varied to match the impedance of the different PCBs. As a result, the integrity of high-speed signals that are communicated between the primary PCB and the secondary PCBs is preserved. Various embodiments of the invention also shield the signal traces in order to reduce the interference due to electromagnetic radiations. The embodiments of the invention provide a system and a method for communicating high-speed signals between printed circuit boards that are cost effective, reliable and less voluminous.

BRIEF DESCRIPTION OF THE DRAWINGS

Various embodiments of the invention will hereinafter be described in conjunction with the appended drawings provided to illustrate and not to limit the invention, wherein like designations denote like elements, and in which:

FIG. 4 illustrates a multi-layer PCB stack-up, in accordance with yet another embodiment of the invention;

DETAILED DESCRIPTION

The various embodiments of the invention describe a system and a method for communicating high-speed signals between multiple PCBS. High-speed signals are communicated between a primary PCB and a plurality of secondary PCBs through flexible multi-layer conductors. These signals include optical communication signals that travel at high speeds.

The system elements, method steps and various embodiments of the present invention are described in detail with reference to the drawings and flow charts.

Figure 1:
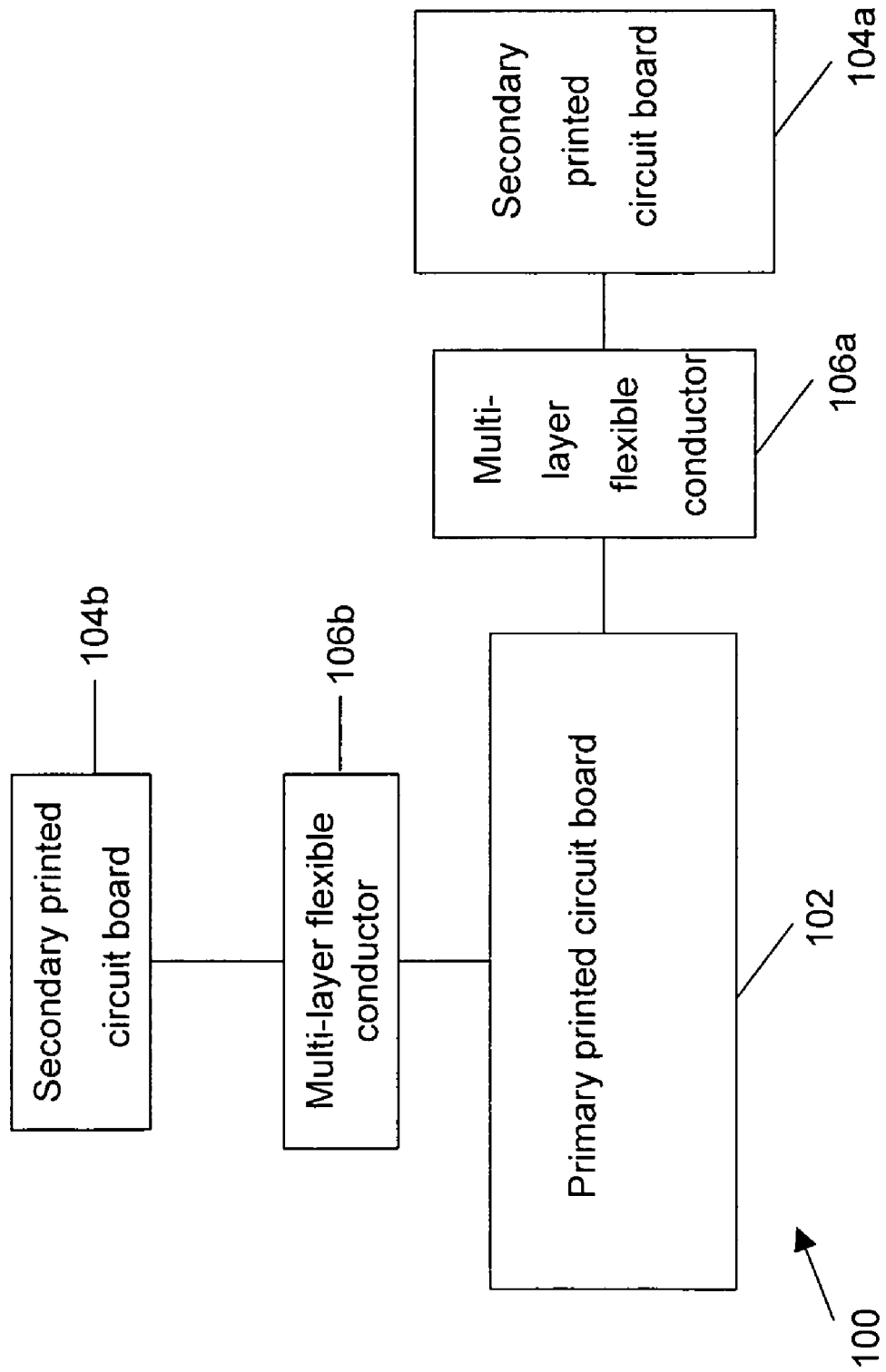
FIG. 1 illustrates a system for high-speed communication, in accordance with an exemplary embodiment of the invention.

FIG. 1 illustrates a system 100 for high-speed communication, in accordance with an exemplary embodiment of the invention. System 100 includes a primary PCB 102, a plurality of secondary PCBs 104, and a plurality of multi-layer flexible conductors 106. The embodiments of the invention are applicable to various combinations of PCBs. For example, an embodiment of the invention is applicable to an arrangement with more than one primary PCB 102. In an embodiment of the invention, secondary PCBs 104 can include a secondary PCB 104a and a secondary PCB 104b. It will be apparent to a person skilled in the art that the embodiments of the invention are applicable to a multiplicity of secondary PCBs. In an embodiment of the invention, plurality of multi-layer flexible conductors 106 include a multi-layer flexible conductor 106a and a multi-layer flexible conductor 106b. It will be apparent to a person skilled in the art that the embodiments of the invention are applicable to a multiplicity of multi-layer flexible conductors.

According to various embodiments of the invention, primary PCB 102 and secondary PCBs 104a and 104b can be manufactured by using a sandwich construction process for multi-layer PCBs. The sandwich construction process for multi-layer PCBs involves etching conducting material, and laminating conductive and insulating material to form a sandwich. Etching is done by either lowering the PCB board in an etching solution, or spraying the etching solution onto the PCB board. Common chemicals for the etching solution include, but are not limited to, ferric chloride, alkaline ammonia, sulphuric acid, hydrogen peroxide, and cupric chloride. Lamination involves gluing the conducting layers of PCB together with an insulating material film in between. In an embodiment of the invention, layers in primary PCB 102 and secondary PCBs 104a and 104b are composed of, for example, copper as the conductive material and kapton polyimide as the insulating material. Further, internal layers of primary PCB 102 and secondary PCBs 104a and 104b can be flexible layers. Rigid portions on the top and bottom surround the flexible layers. In an embodiment of the invention, the PCB manufactured by the sandwich construction process can be flexible enough to allow bending without breaking the conducting layers.

In an embodiment of the invention, multi-layer flexible conductor 106 includes at least two layers. In one embodiment of the invention, multi-layer flexible conductor 106 is a metallic conductor. It will be apparent to a person skilled in the art that multi-layer flexible conductor 106 may be made of any conducting metal capable of communicating high-speed signals. For example, multi-layer flexible conductor 106 can be made of copper, nickel, silver, tin, tin-lead, gold or any of the like, without deviating from the scope of the invention. Further, multi-layer flexible conductor 106 allows secondary PCB 104 to be placed at any angle with respect to primary PCB 102. This implies that secondary PCBs 104a and 104b can be positioned at a desired angle with respect to primary PCB 102. For instance, if the housing for the plurality of PCBs is small, secondary PCBs 104a and 104b can be folded on the sides of primary PCB 102 so that they occupy lesser space in one plane.

In an embodiment of the invention, primary PCB 102 and secondary PCBs 104a and 104b are multi-layer PCBs. In one embodiment of the invention, the number of layers in primary PCB 102 and secondary PCBs 104a and 104b is six. However, the number of layers should not be considered being limited to six. According to other embodiments, the number of layers in primary PCB 102 and secondary PCBs 104a and 104b can be four, eight, or any other number applicable to the various embodiments of the invention.

Primary PCB 102 is connected to a plurality of secondary PCBs 104a and 104b through multi-layer flexible conductor 106a and multi-layer flexible conductor 106b, respectively. Multi-layer flexible conductors 106a and 106b enable high-speed communication between primary PCB 102 and secondary PCBs 104a and 104b.

According to an embodiment of the invention, primary PCB 102, secondary PCBs 104a and 104b, and multi-layer flexible conductors 106a and 106b, can be manufactured as a single piece. Hence, the invention alleviates reliability problems associated with the soldering of different components.

Figure 2:
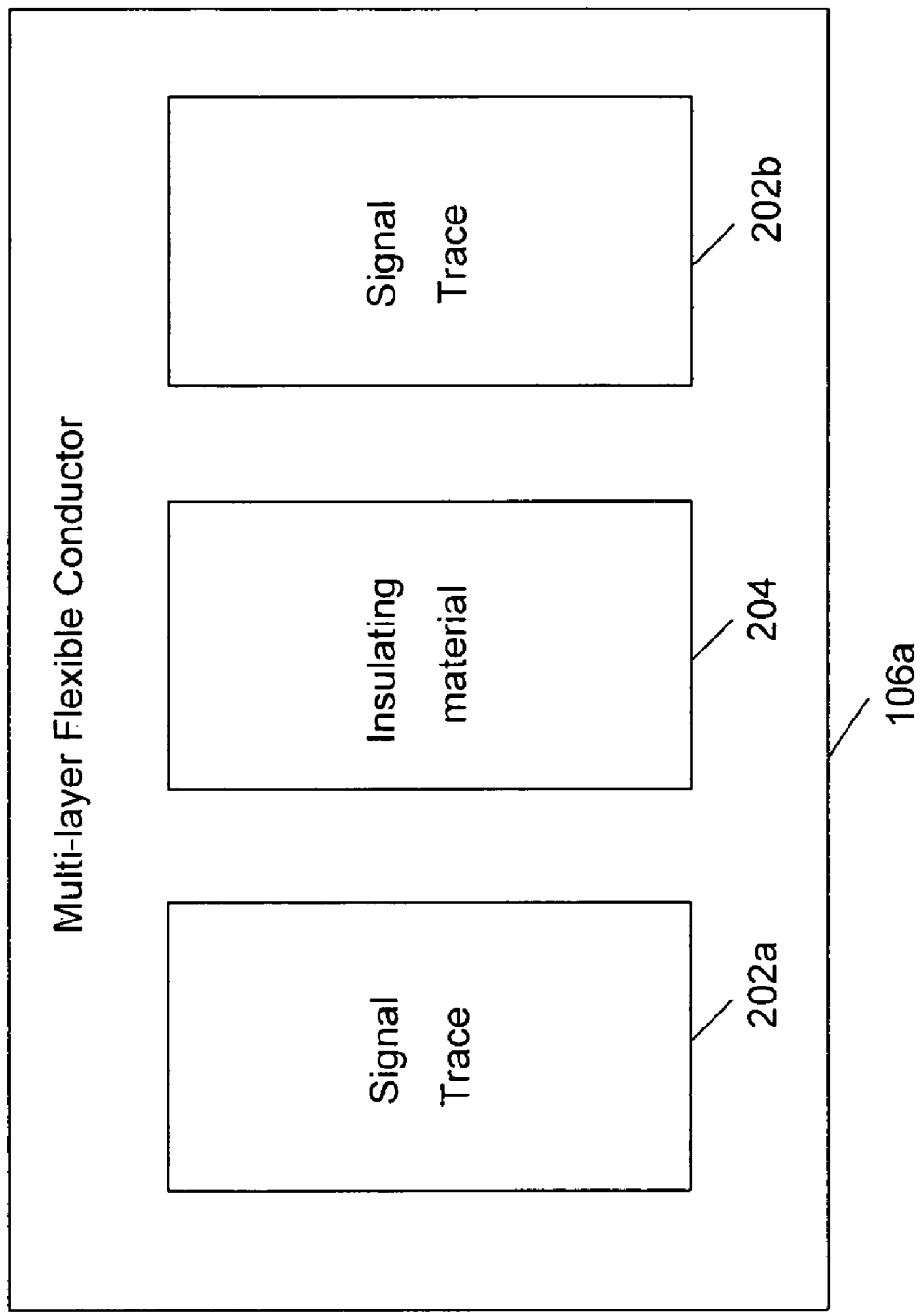
FIG. 2 illustrates a multi-layer flexible conductor, in accordance with various embodiments of the invention.

FIG. 2 illustrates a multi-layer flexible conductor 106, in accordance with an embodiment of the invention. Multi-layer flexible conductor 106 includes a plurality of signal traces 202, and an insulating material 204. According to an embodiment of the invention, plurality of signal traces 202 include a signal trace 202a and a signal trace 202b. It will be apparent to a person skilled in the art that the present invention is applicable to a multiplicity of signal traces.

Insulating material 204 separates signal traces 202a and 202b. According to an embodiment of the invention, insulating material 204 is a fibreglass epoxy resin (dielectric constant=4.5). However, the invention should not be construed to be limited to the use of fiberglass epoxy resin only. Other insulating materials such as PTFE (dielectric constant=3.9), Polyimide resin (dielectric constant=3.9), Teflon (dielectric constant=2.1) or any of the like can also be used without deviating from the scope of the invention. Dielectric constant of insulating material 204 is one of the parameters that is used to calculate the 'characteristic impedance' of signal traces 202a and 202b.

The characteristic impedance is the impedance that a signal trace would have if the signal trace were infinitely long. The characteristic impedance is a property resulting from the combined effects of inductive, capacitive, and resistive characteristics of a signal trace. These values are determined by physical parameters such as the size of the conductors, the distance between the conductors, and the properties of the insulating material. For communication of high-speed signals in a system, it is required that the characteristic impedance be maintained constant throughout the system. Abrupt changes in the characteristic impedance cause signal reflections, which manifest as distortion in the signal transmissions. In an embodiment of the invention, other parameters that are used to calculate characteristic impedance of signal traces 202a and 202b include, but are not limited to, separation distance between flexible planes of multi-layer flexible conductor 106a, and width dimensions of signal traces 202a and 202b.

According to the various embodiments of the invention, the width and separation distance of signal traces 202a and 202b can be adjusted during the manufacturing process in accordance with design requirements of system 100. For example, a design requirement could be to maintain a constant impedance of 100 Ohms across various PCBs. Variation in the width and separation between signal traces 202a and 202b maintains constant impedance between primary PCB 102 and secondary PCBs 104a and 104b. This reduces any impedance discontinuities that may occur during the communication of high-speed signals between primary PCB 102 and secondary PCBs 104a and 104b. Hence, the integrity of high-speed signals that are communicating between primary PCB 102 and secondary PCBs 104a and 104b is preserved.

Signal traces 202a and 202b are embedded between the two outer layers of the PCBs. This arrangement reduces interference of electromagnetic radiations with the signal traces. Thus, the signal traces are shielded from outside stray signals. Embedding signal traces 202a and 202b between the two outer layers of the plane of the PCBs also prevents leakage of electromagnetic radiations originating from the signal traces that can interfere with an adjacent circuitry.

Figure 3:
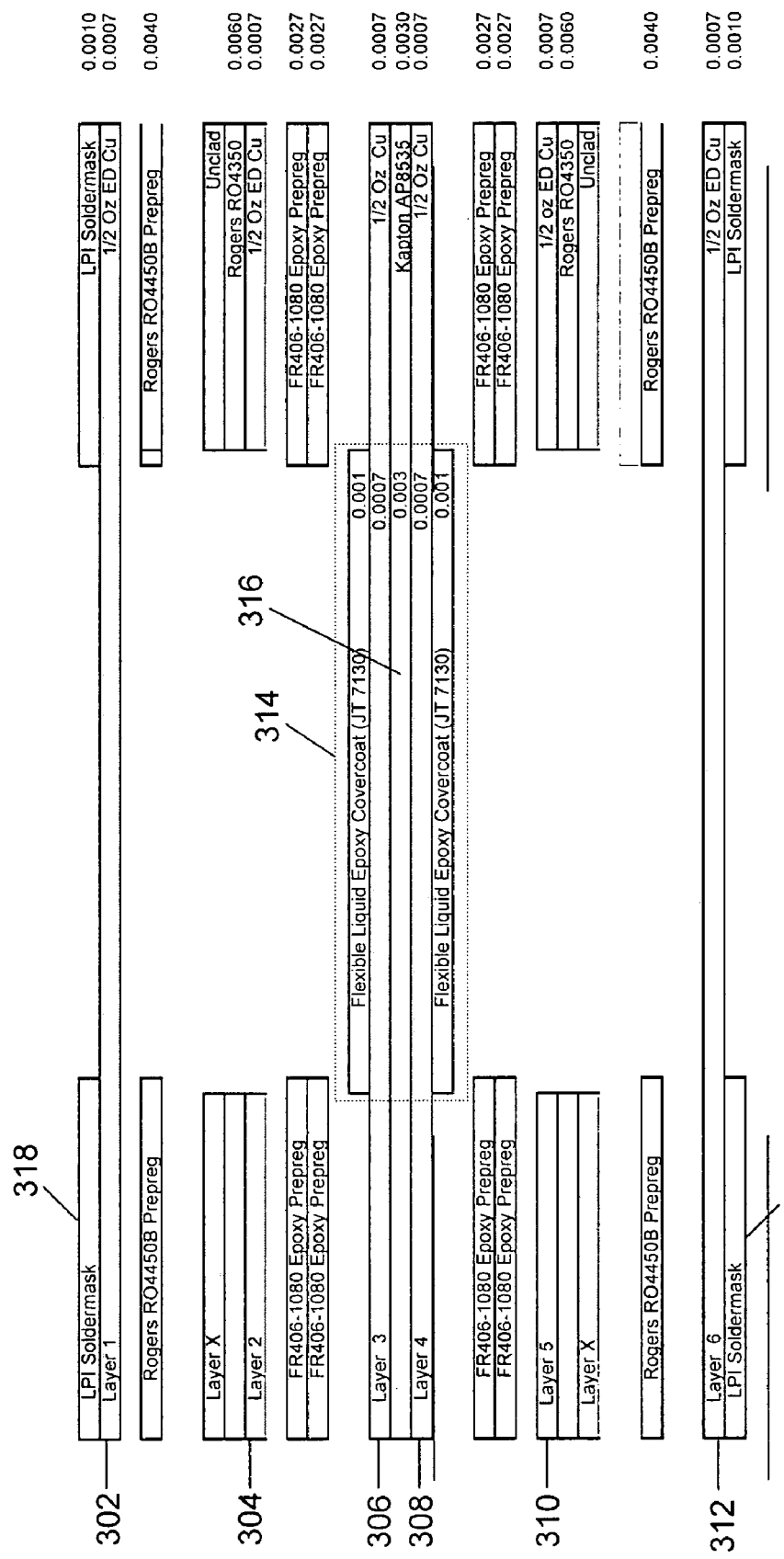
FIG. 3 illustrates a multi-layer PCB stack-up, in accordance with an exemplary embodiment of the invention.

FIG. 3 illustrates a multi-layer PCB 300 stack-up, in accordance with an exemplary embodiment of the invention. According to this embodiment of the invention, multi-layer PCB 300 has a rigid-flex-rigid configuration. Multi-layer rigid portion includes six conducting layers, a layer 302, a layer 304, a layer 306, a layer 308, a layer 310, and a layer 312. According to this embodiment, each conducting layer can be made of half ounce of copper and be 0.0007 inches in thickness. According to this exemplary embodiment, rigidity in multi-layer rigid portion is due to the presence of -Rogers RO4450B prepreg layers. A multi-layer flexible portion 314 includes two conducting layers, layer 306, and layer 308, which are separated by an insulating layer 316 of Kapton. According to an exemplary embodiment, multi-layer flexible portion 314 is flexible due to the absence of Rogers RO4450B prepreg layers. Further, layer 306 and layer 308 are surrounded by 0.001 inches thick flexible liquid epoxy covercoat, which acts as an insulator. The total thickness of multi-layer flexible portion is 0.0064 inches. The total thickness of multi-layer rigid portion is 0.0400 inches.

As illustrated in FIG. 3, layer 302 is adjacent to an outer layer 318. Outer layer 318 can include LPI soldermask. Similarly, layer 312 is adjacent to an outer layer 320, which can include LPI soldermask. LPI soldermask masks and insulates, physically as well as electrically, the portions of multi-layer PCB 300 stack-up, which do not require soldering. It will be apparent to a person skilled in the art that the present invention is applicable to other PCB stack-up configurations also. FIG. 4 illustrates an alternate PCB 400 stack-up, in accordance with yet another embodiment of the invention.

Figure 5:
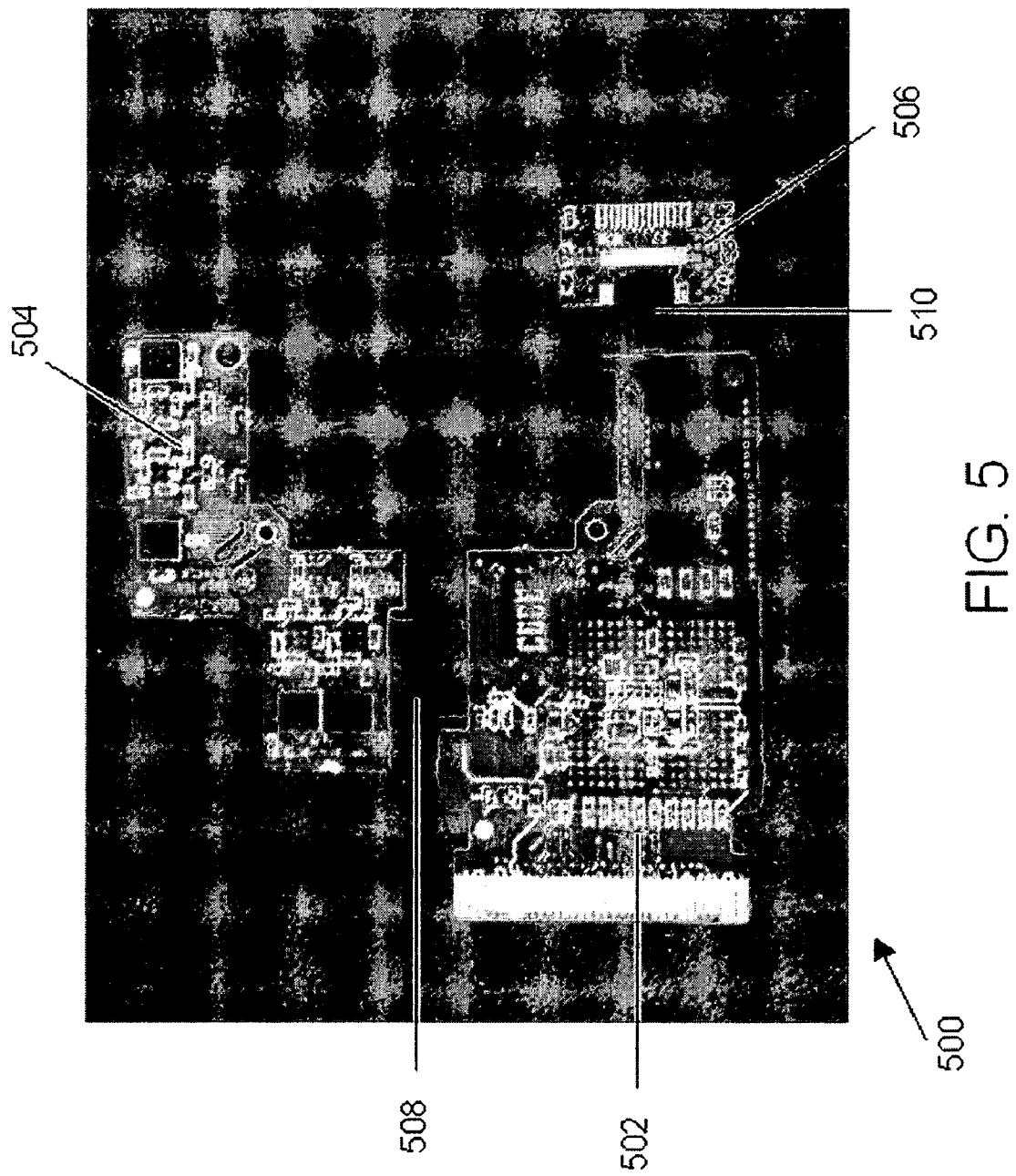
FIG. 5 illustrates a system for high-speed communication, in accordance with another embodiment of the invention.

FIG. 5 illustrates a system 500 for high-speed communication in accordance with another embodiment of the invention. System 500 includes a primary PCB 502, a secondary PCB 504, a secondary PCB 506, a multi-layer flexible conductor 508, and a multi-layer flexible conductor 510 in a horizontal plane. Secondary PCB 504 is positioned at an angle of 180 degrees with respect to primary PCB 502 through multi-layer flexible conductor 508, which lies in a straight position in the horizontal plane. Secondary PCB 506 is also positioned at an angle of 180 degrees with respect to primary PCB 502 through multi-layer flexible conductor 510, which also lies in a straight position in the horizontal plane.

Figure 6:
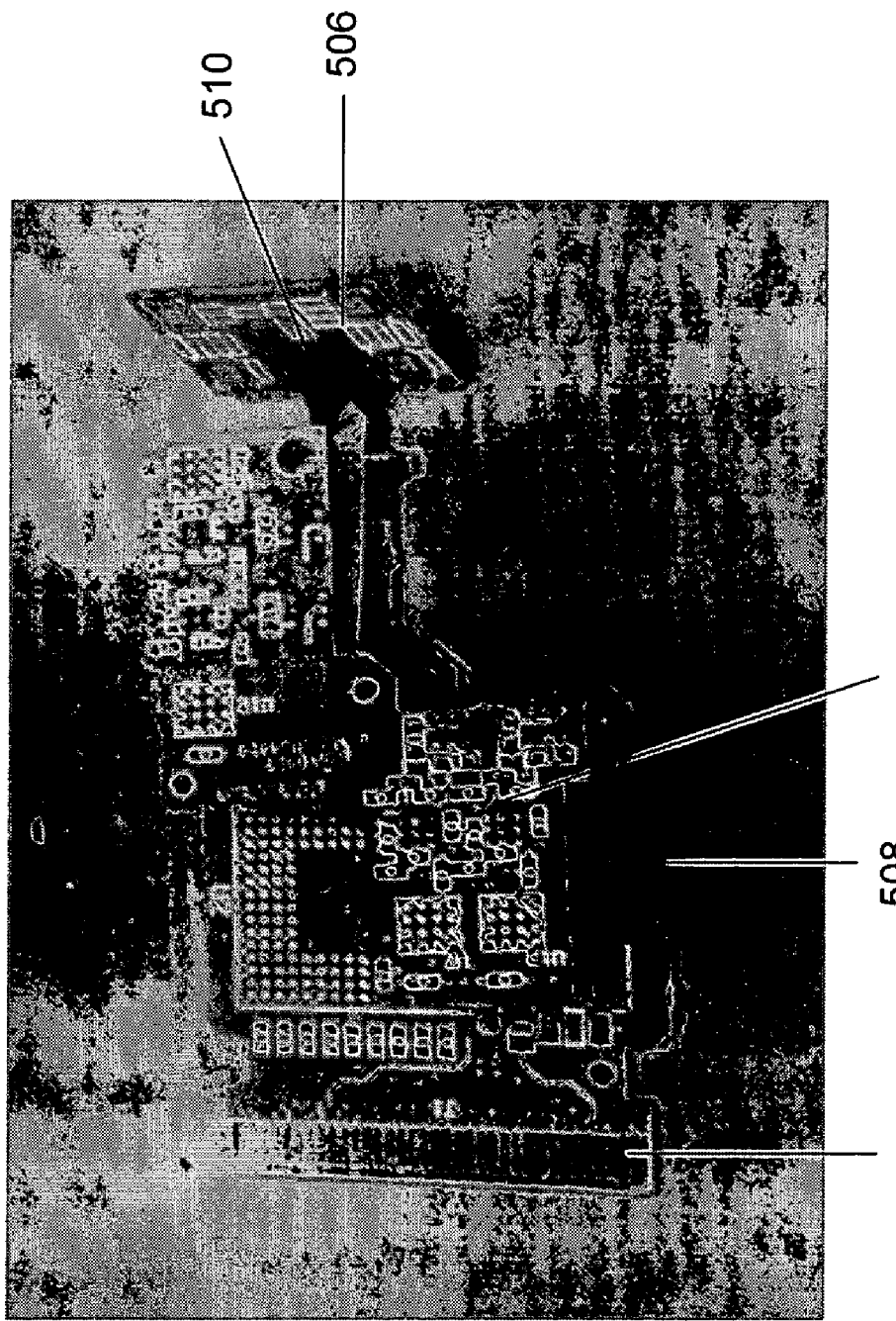
FIG. 6 illustrates a system for high-speed communication, in accordance with yet another embodiment of the invention.

FIG. 6 illustrates a system 600 for high-speed communication, in accordance with yet another embodiment of the invention. System 600 illustrates the flexibility of connecting the PCBs, offered by the various embodiments of the invention. The flexibility offered by the invention allows space saving in an arrangement where a plurality of PCBs are required to be placed in a small housing. In system 600, secondary PCB 504 is illustrated in a position that is achieved after folding it over primary PCB 502. In other words, the angle between primary PCB 502 and secondary PCB 504 is zero degrees. Thus, the horizontal space required for placing the PCBs is saved. In addition, secondary PCB 506 is illustrated as being folded at an angle of 60 degrees with respect to primary PCB 502.

Figure 7:
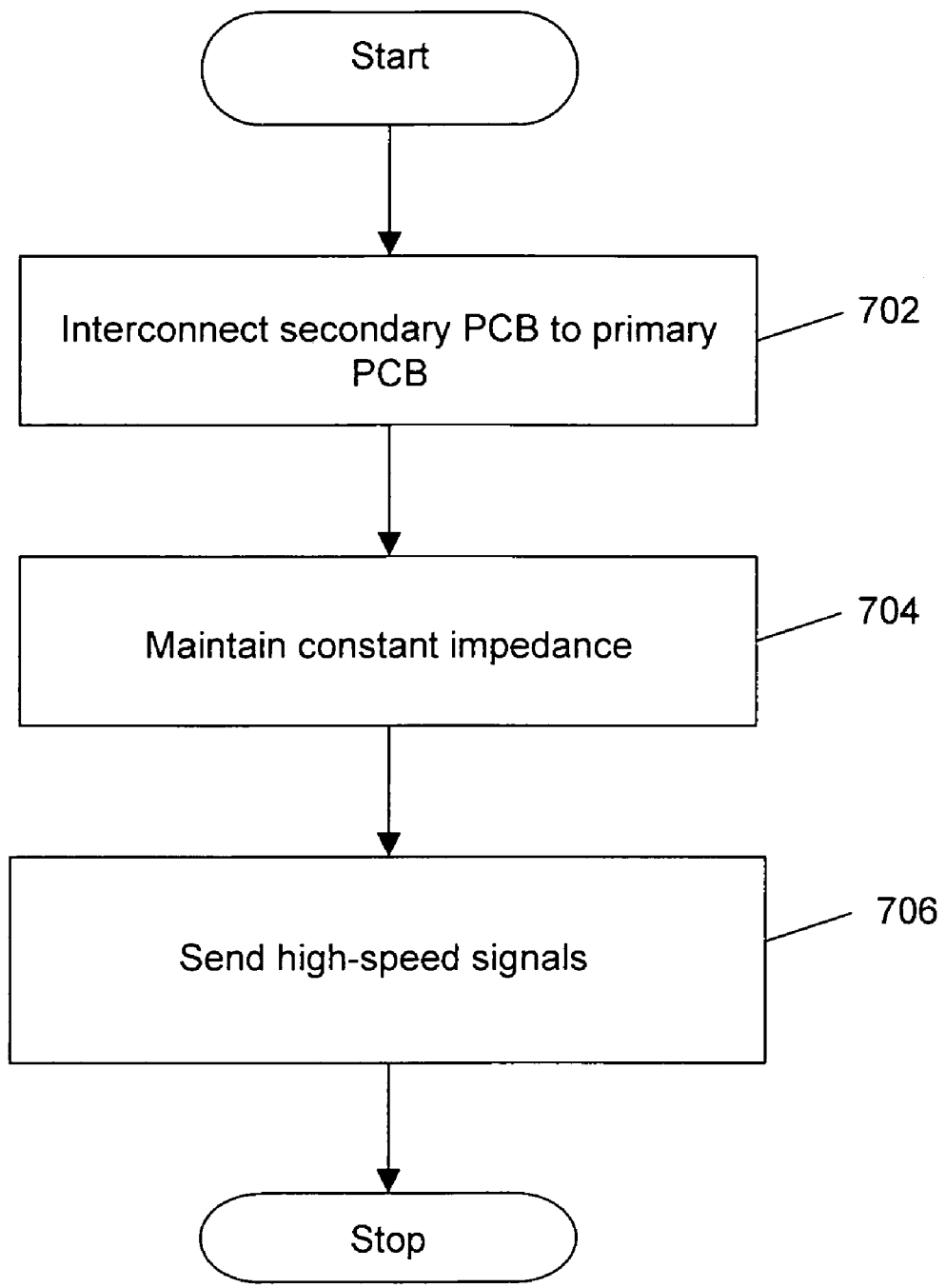
FIG. 7 is a flow chart that illustrates a method for communicating high-speed signals between printed circuit boards, in accordance with various embodiments of the invention.

FIG. 7 is a flow chart illustrating a method for communicating high-speed signals between primary PCB 102 and secondary PCBs 104a and 104b, in accordance with various embodiments of the invention. At step 702, primary PCB 102 is connected to secondary PCBs 104a and 104b through multi-layer flexible conductors 106a and 106b, respectively. At step 702, secondary printed circuit boards 104a and 104b are rotated at a desired angle with respect to primary printed circuit board 102. In various embodiments of the invention, the angle of rotation depends on the availability of space inside the housing for arranging the PCBs. For example, secondary PCBs 104a and 104b can be connected at an angle of 180 degrees and 60 degrees, respectively, to primary PCB 102, depending on the space available for arranging the PCBs inside the housing. At step 704, constant impedance is maintained between primary PCB 102 and secondary PCBs 104a and 104b. Step 704 further includes adjusting the width and separation between signal traces 202a and 202b, to maintain constant impedance between primary PCB 102 and secondary PCBs 104a and 104b. According to the various embodiments of the invention, the width and separation distance of signal traces 202a and 202b can be adjusted during the manufacturing process in accordance with the design requirements of system 100. At step 706, high-speed signals are sent between primary PCB 102 and secondary PCBs 104a and 104b.

Furthermore, the method for communicating high-speed signals between primary PCB 102 and secondary PCBs 104a and 104b includes shielding of signal traces 202a and 202b. Signal traces 202a and 202b are embedded between two outer layers of the plane of the PCBs to reduce interference due to electromagnetic radiations. Thus, signal traces 202a and 202b are shielded from any outside stray signals. Embedding signal traces 202a and 202b between the two outer layers of the plane of the PCBs also prevent leakage of electromagnetic radiations originating from the signal traces that can interfere with an adjacent circuitry.

It will be evident to a person ordinarily skilled in the art that one or more of the embodiments mentioned above provide the following advantages for communicating high-speed signals between the PCBs. The embodiments of the invention enable communication of high-speed signals between a primary PCB and plurality of secondary PCBs through a plurality of multi-layer flexible conductors. The embodiments of the invention enable interconnection of the secondary PCBs to the primary PCB through the multi-layer flexible conductors. The embodiments of the invention enable the secondary PCBs to be placed at a desired angle with respect to the primary PCB through the multi-layer flexible conductors. This enables packaging of multiple PCBs in small volume leading to compact circuitry. The embodiments of the invention further enable variation in the width and the separation between the signal traces. The embodiments of the invention also maintain constant impedance between the primary PCB and the secondary PCBs. Thus, the embodiments of the invention preserve the integrity of high-speed signals that are communicating between the primary PCB and the secondary PCBs. The embodiments of the invention also enable shielding of the signal traces to reduce electromagnetic radiations from and to the signal traces. In addition, the embodiments of the invention eliminate the need for soldering together of different components, and hence alleviate the reliability problems associated with the solder joints. The embodiments of the invention provide a system and a method for communicating high-speed signals between printed circuit boards that is cost effective, reliable and less voluminous.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. A system for high-speed communication between a plurality of printed circuit boards, the system comprising:
   a. a primary printed circuit board;
   b. at least one secondary printed circuit board;
   c. at least one multi-layer flexible conductor for sending high-speed signals between the primary printed circuit board and the secondary printed circuit board while maintaining a constant characteristic impedance between the primary printed circuit board and the at least one secondary printed circuit board, wherein the multi-layer flexible conductor enables the secondary printed circuit board to be placed at an angle with respect to the primary printed circuit board; and
   d. one or more signal traces for conducting the high-speed signals in the primary printed circuit board, the at least one secondary printed circuit board, and the at least one multi-layer flexible conductor;
   wherein the primary printed circuit board, the at least one secondary printed circuit board, and the at least one multi-layer flexible conductor are manufactured as a single piece such that the one or more signal traces are continuous conductor without encountering any connectors, junctions, or soldered regions.

2. The system according to claim 1, wherein the width of the signal traces is constructed and arranged so that a constant characteristic impedance is maintained between the primary printed circuit board and the at least one secondary printed circuit board.

3. The system according to claim 1, wherein the signal traces are separated by an insulating material.

4. The system according to claim 3, wherein the separation between the signal traces is constructed and arranged so that a constant characteristic impedance is maintained between the primary printed circuit board and the at least one secondary printed circuit board.

5. The system according to claim 3, wherein the multi-layer flexible conductor comprises copper; and the insulating material comprises one or more of kapton polyimide, fiberglass epoxy resin, and PTFE.

6. The multi-layer flexible conductor according to claim 1, wherein the signal traces are embedded between two outer layers of the plane of at least one of the primary and secondary printed circuit board.

7. The system according to claim 1, wherein the multi-layer flexible conductor comprises two layers.

8. The system according to claim 1, wherein the multi-layer flexible conductor comprises one or more of copper, nickel, silver, tin, tin-lead, and gold.

9. The system according to claim 1, wherein the primary printed circuit board, the at least one secondary printed circuit board, and the at least one multi-layer flexible conductor are manufactured as a single piece such that at least one signal trace present in the primary printed circuit board, the at least one secondary printed circuit board, and the at least one multi-layer flexible conductor is capable of conducting the high-speed signals between the primary printed circuit board and the at least one secondary printed circuit board without the signals crossing a jumper, a connector or a soldered region.

10. A system for high-speed communication between a plurality of printed circuit boards, the system comprising:
    a. a primary printed circuit board;
    b. at least one secondary printed circuit board; and
    c. at least one multi-layer flexible conductor for sending high-speed signals between the primary printed circuit board and the secondary printed circuit board, wherein the multi-layer flexible conductor, the primary printed circuit board, and the at least one secondary printed circuit board comprise signal traces, wherein the signal traces are present on the layers and are separated by an insulating material, wherein the width and spacing of the signal traces are constructed and arranged so that a constant characteristic impedance is maintained between the primary printed circuit board and the at least one secondary printed circuit board; and wherein the primary printed circuit board, the at least one secondary printed circuit board, and the at least one multi-layer flexible conductor are manufactured as a single piece such that the signal traces are continuous conductor without encountering any connectors, junctions, or soldered regions.

11. The system according to claim 10, wherein the multi-layer flexible conductor enables the secondary printed board to be placed at an angle with respect to the primary printed circuit board.

12. The system according to claim 10, wherein the signal traces are embedded between two outer layers of the plane of at least one of the primary and secondary printed circuit board.

13. A system for high-speed communication between a plurality of printed circuit boards, the system comprising:
    a. a primary printed circuit board;
    b. at least one secondary printed circuit board; and
    c. at least one multi-layer flexible conductor for sending high-speed signals between the primary printed circuit board and the secondary printed circuit board, wherein the multi-layer flexible conductor, the primary printed circuit board, and the at least one secondary printed circuit board are comprise signal traces embedded between two outer layers of the plane of at least one of the primary and secondary printed circuit board to reduce electromagnetic radiation, wherein the width and spacing of the signal traces are constructed and arranged so that a constant characteristic impedance is maintained between the primary printed circuit board and the at least one secondary printed circuit board; and wherein the primary printed circuit board, the at least one secondary printed circuit board, and the at least one multi-layer flexible conductor are manufactured as a single piece such that the signal traces are continuous conductor without encountering any connectors, junctions, or soldered regions.

14. A method for communicating high-speed signals between printed circuit boards, the method comprising the steps of:
   a. interconnecting a primary printed circuit board with at least one secondary printed circuit board, wherein the interconnecting being done through multi-layer flexible conductors comprising signal traces, separated by an insulating material, and the primary printed circuit board, and the at least one secondary printed circuit board are comprised of the signal traces; wherein the primary printed circuit board, the at least one secondary printed circuit board, and the multi-layer flexible conductors are manufactured as a single piece such that the signal traces are continuous conductor without encountering any connectors, junctions, or soldered regions;
   b. maintaining constant characteristic impedance between the primary printed circuit board and the secondary printed circuit board; and
   c. sending high-speed signals between the primary printed circuit board and the secondary printed circuit board while the constant characteristic impedance is maintained.

15. The method according to claim 14, wherein the step of interconnecting comprises placing the secondary printed circuit board at an angle with respect to the primary printed circuit board.

16. The method according to claim 14, wherein the step of maintaining constant characteristic impedance between the primary printed circuit board and the secondary printed circuit board comprises adjusting the width of the signal traces.

17. The method according to claim 14, wherein the step of maintaining constant characteristic impedance between the primary printed circuit board and the secondary printed circuit board comprises adjusting the separation between the signal traces.

18. The method according to claim 14 further comprises the step of shielding the signal traces, wherein the shielding is done by embedding the signal traces between outer layers of the plane of at least one of the primary and secondary printed circuit board.

19. The method according to claim 14, wherein the multi-layer flexible conductor comprises one or more of copper, nickel, silver, tin, tin-lead, and gold.

20. The method according to claim 14, wherein the multi-layer flexible conductor comprises copper; and the insulating material comprises one or more of kapton polyimide, fiberglass epoxy resin, and PTFE.

* * * * *

UNITED STATES PATENT AND TRADEMARK OFFICE
CERTIFICATE OF CORRECTION

PATENT NO.       : 7,601,919 B2                         Page 1 of 1
APPLICATION NO.  : 11/255724
DATED            : October 13, 2009
INVENTOR(S)      : Phan et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 540 days.

Signed and Sealed this

Fifth Day of October, 2010

David J. Kappos
*Director of the United States Patent and Trademark Office*